United States Patent [19]

Aoki et al.

[11] Patent Number: 5,298,761
[45] Date of Patent: Mar. 29, 1994

[54] METHOD AND APPARATUS FOR EXPOSURE PROCESS

[75] Inventors: Atsuyuki Aoki, Kanagawa; Muneyasu Yokota, Tokyo, both of Japan

[73] Assignee: Nikon Corporation, Tokyo, Japan

[21] Appl. No.: 899,549

[22] Filed: Jun. 16, 1992

[30] Foreign Application Priority Data

Jun. 17, 1991 [JP] Japan .................................. 3-170375

[51] Int. Cl.⁵ ...................... G01N 21/86; G01B 11/00
[52] U.S. Cl. ..................................... 250/548; 356/401
[58] Field of Search ................ 250/548, 557; 356/401, 356/399–400

[56] References Cited

U.S. PATENT DOCUMENTS

| | | | |
|---|---|---|---|
| 4,878,086 | 10/1989 | Isohata et al. | 356/401 |
| 4,900,939 | 2/1990 | Aoyama | 250/548 |
| 4,918,320 | 4/1990 | Hamasaki et al. | 250/548 |
| 5,017,514 | 5/1991 | Nishimoto | 356/401 |
| 5,153,678 | 10/1992 | Ota | 250/548 |
| 5,225,686 | 7/1993 | Edo | 250/548 |
| 5,243,195 | 9/1993 | Nishi | 250/548 |

Primary Examiner—Michael Messimber
Attorney, Agent, or Firm—Keck, Mahin & Cate

[57] ABSTRACT

In the manufacture of a device having a relatively large area, e.g., a liquid crystal device by a lithographic technique, using at least one of a plurality of original images and defining an exposed pattern by each original image as an individual subdivision area, the position of a substrate is changed relatively upon exposure of every subdivision area to expose on the substrate a composite exposed pattern of a relatively large area composed of the plurality of abutting and combined subdivision areas. When aligning each of the original images with the substrate in accordance with predetermined target position information, the amounts of relative deviation at the abutting portions of the subdivision areas (i.e., stitching errors) are preliminarily determined and compensating values tending to reduce each of the stitching errors to less than a given tolerance value are added to the target position information, thereby effecting the alignment. Thus, the stitching accuracy is improved for the composite pattern on the whole.

18 Claims, 8 Drawing Sheets

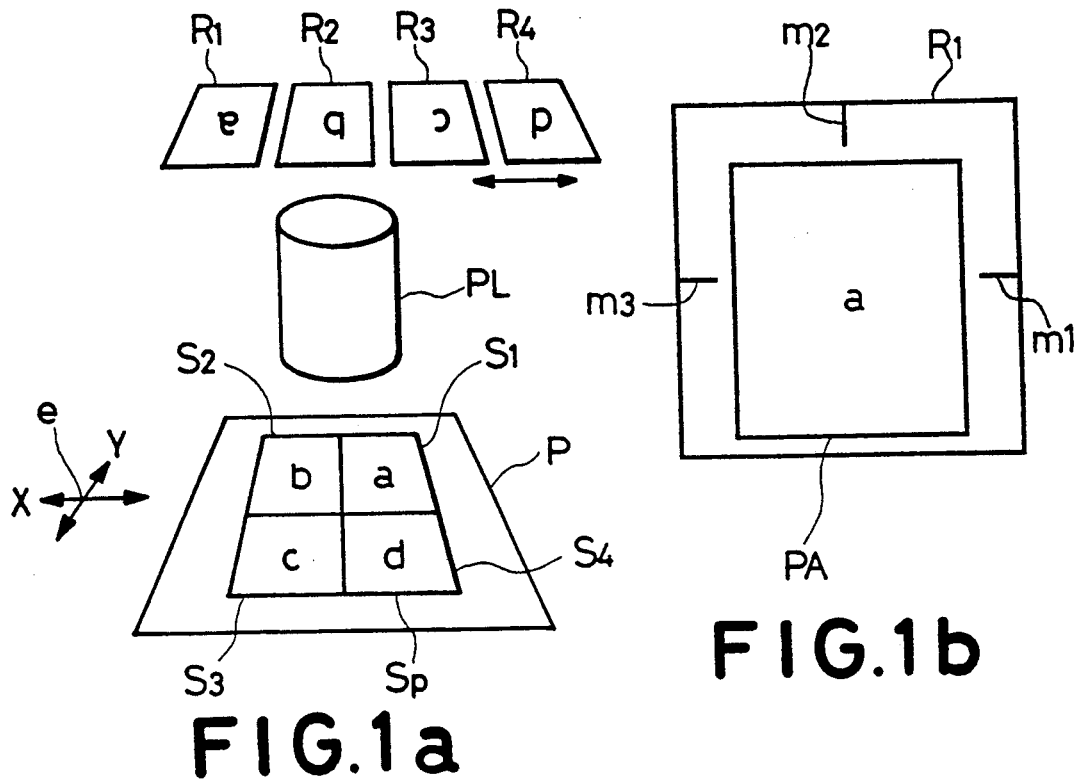
FIG.1a
FIG.1b
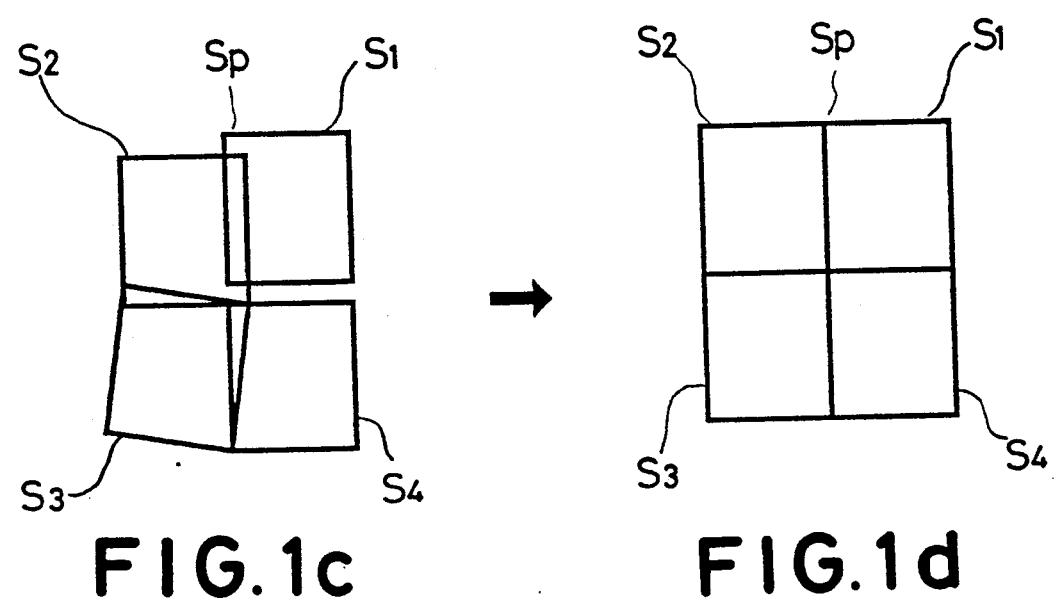
FIG.1c
FIG.1d

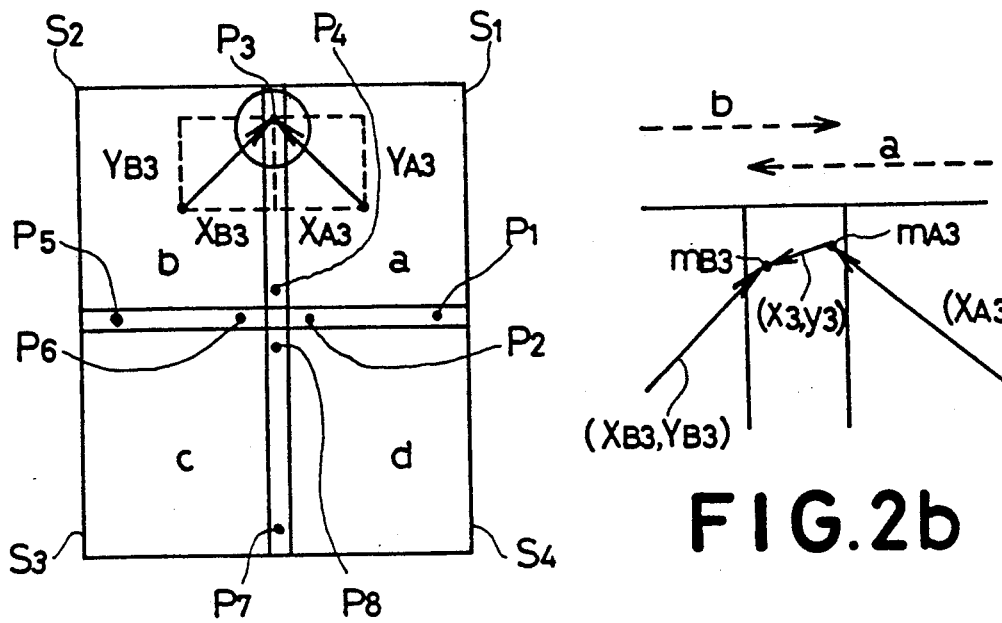
FIG.2a
FIG.2b
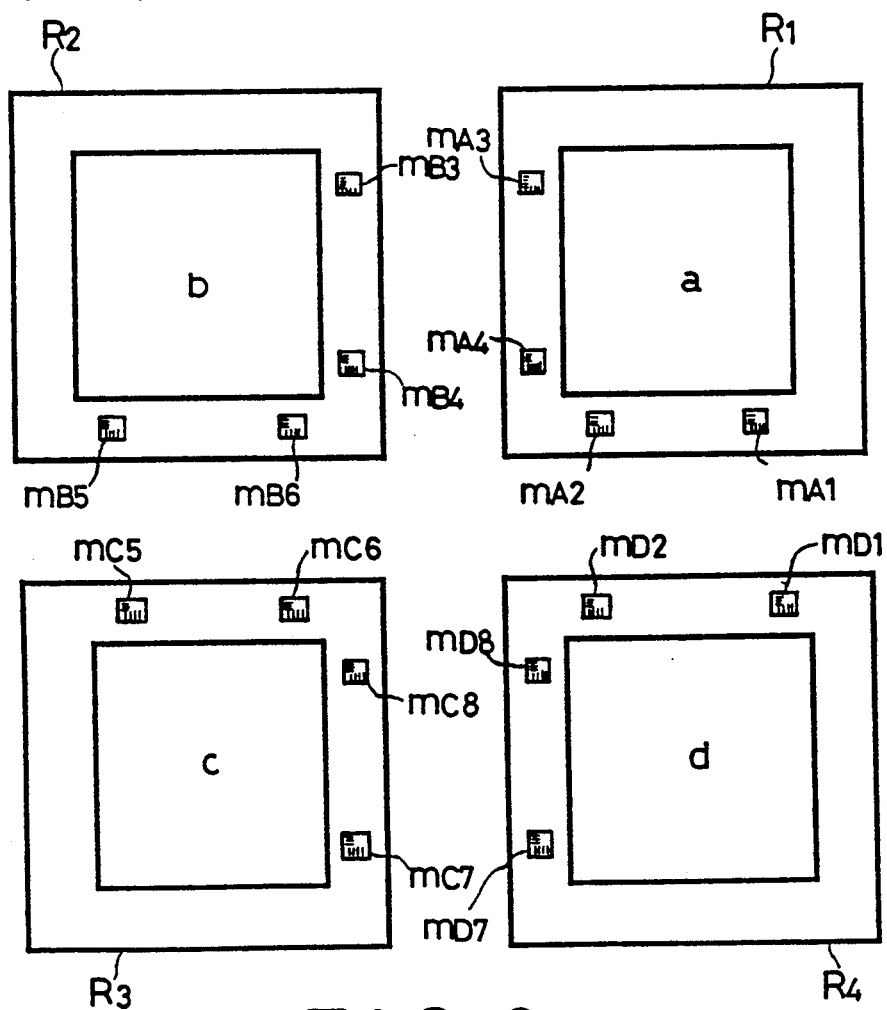
FIG.3

$$X_p = \frac{X_a + X_b}{2}$$

METHOD AND APPARATUS FOR EXPOSURE PROCESS

BACKGROUND OF THE INVENTION

1. Field of the Invention

The present invention relates to an exposure method which is particularly useful in the manufacture of devices that are relatively large in area, e.g., liquid crystal devices by lithographic techniques and more particularly to an exposure method for exposing a plurality of abutting subdivision patterns so as to effect the exposure of a large-area pattern made by composing (stitching) images and apparatus therefor.

2. Description of the Prior Art

In the past, in the manufacuture for example of liquid crystal panel devices or the like for display units, there has been used a method in which while changing a plurality of original image reticles, the original image patterns of the respective reticles are stitched together by image composition and the resulting large-area composite image pattern is exposed onto a substrate. In this case, under the ideal alignment conditions a single composite image is composed of the subdivision areas or the effective exposure zones of the respective original images which have been accurately abutted and composed or stitched together without any gaps or overlaps.

In other words, at least one alignment mark is formed at the same design position on each of the individual reticles and an alignment is effeced by the reticle alignment systems in such a manner that the alignment mark of a reticle carried on the reticle holder of an exposure apparatus comes into registration with the alignment reference mark of the apparatus on the reticle holder.

A substrate subject to the exposure is held on a movable stage and the movement of the stage is subjected to position control by laser interferometers. After the exposure of one reticle has been effected, the exposure to the abutting area is effected according to the next reticle. In this case, the movement of the stage is of course controlled to the distance corresponding to the size of the subdivision area exposed previously.

With the conventional techniques, it has been usual so that where the alignment marks of the individual reticles involve positional faults due to errors caused during the manufacture, etc., (including any positional fault within the reticle plane and any positional fault in the thickness direction due to variations in the reticle thickness), there are mark detection errors, etc., due to the reticle alignment systems, or there are any distortion of the projected image due to the remaining imaging characteristic error components (e.g., projection magnification errors, distortions, etc.,), the subdivision areas are caused to shift in position in the x or y direction relative to each other, or rotational errors are caused relative to each other or they are distorted, thus failing to attain an accurate abutting composition. Thus, there is the disadvantage of deteriorating the quality of the whole area of the resulting device such as a liquid crystal panel.

SUMMARY OF THE INVENTION

It is the primary object of the present invention to provide an exposure method and apparatus so designed that during the previously mentioned exposure by image composition, presupposing that the alignment marks of individual original images tend to potentially involve errors with respect to the design values, relative positional deviations of the abutting subdivision areas (stitching errors) can each be maintained less than a given tolerance value or can be reduced on an average, for example, thereby improving the stitching accurary of a composite pattern on the whole.

To accomplish the above object, in accordance with the present invention there is thus provided an exposure method and apparatus so designed that at least one of a plurality of original images containing the same or different patterns is used and the positions of a light sensitive substrate and the original images are relatively moved to successively expose the patterns to abut and compose a plurality of subdivision areas each representing an exposure area by each original image, thereby exposing on the light-sensitive substrate a composite pattern composed of the plurality of patterns stitched together.

To accomplish the above object, in accordance with one aspect of the present invention there is thus provided an exposure method comprising the steps of effecting an alignment between the original images and the light-sensitive substrate pattern by pattern in accordance with predetermined target position information, preliminarily determining the amounts of relative deviation in exposure position at the abutting portions of the respective subdivision areas in the composite pattern, supplying compensating values (offset values) for making the amounts of deviation in exposure position at each abutting portion less than a given tolerance value to the target position information, effecting an alignment between the original images and the light sensitive substrate pattern by pattern and then effecting the exposure.

In accordance with another aspect of the present invention, there is provided an exposure apparatus comprising holding means for holding a plurality of original images substantially parallel to a light-sensitive substrate, original image alignment means for aligning each original image relative to the reference position of the apparatus, stage means adapted to hold the light-sensitive substrate and movable within a plane, moving means for moving the light-sensitive substrate relative to the original image, optical means for exposing the pattern of the original image onto the light-sensitive substrate, control means whereby during successive exposure onto the same light-sensitive substrate of at least one of the plurality of original images each containing the same or a different pattern, the moving means is controlled in accordance with predetermined target position information in such a manner that a plurality of subdivision areas each consisting of an exposure area of the at least one original image are abutted and composed, and compensating means for computing compensating values (offset values) such that predetermined amounts of relative deviation in exposure position at the respective abutting portions of the subdivision areas are made less than a given tolerance value and supplying the compensating values to the control means and/or the original image alignment means.

In accordance with the exposure method of the present invention, when aligning the original images with the light-sensitive substrate prior to the exposure, the amounts of relative deviation in exposure position at the abutting portions of the respective subdivision areas (hereinafter the amounts of relative deviation in exposure position at the abutting portions may sometime be referred to as stitching errors) are preliminarily determined. The stitching errors include the positional errors of the mark patterns, e.g., the alignment marks of the original images caused during manufacture, the mark detection errors of the reticle alignment systems, the image distortions due to the distortion or the like of the projection optical system, and the methods of determining the stitching errors may be roughly divided into two types.

In other words, the first method of measuring the positions of the marks on the exposure apparatus prior to a main exposure and determining the stitching errors from the results of the measurement by calculation and the second method of effecting a test exposure prior to a main exposure and directly measuring the amounts of deviation in the positions of the marks in the resulting exposed pattern or developed pattern can be conceived.

Firstly, according to the first method the positions of the mark patterns are measured preliminarily in terms of the coordinates of the reference position of the exposure apparatus and the results of the measurement are compared with the design position information of the mark patterns, thereby determining the stitching errors of the abutting subdivision areas from the positional deviations between the two.

As the mark patterns, the pattern elements or special marks present at the known design positions within the pattern of the effective exposure area (subdivision area) of the original image or the special marks, e.g., the alignment marks formed on the peripheral portion on the outside of the effective exposure area can be utilized. Also, especially it is possible to utilize such vernier scale marks provided on the original images so as to form micrometer-like main gauges and auxiliary or vernier gauges at the abutting portions between the adjoining subdivision areas.

In accordance with the second method, the patterns on the respective original images are exposed onto the resist layer on a substrate as a trial exposure for the so-called condition determination prior to a main exposure or as a part of the main exposure in cases where a plurality of composite patterns are exposed onto the same substrate. The composite exposed pattern formed on the substrate by this exposure is subjected to optical measurements in the form for example of a latent image pattern formed in the resist layer by the exposure or an uneven pattern following the development of the exposed resist layer, thereby measuring the stitching errors at each of the abutting portions. In the exposure of such cases, it is also possible to utilize the previously mentioned mark patterns for position measuring purposes.

In the case of this second method, the present invention can also be applied to a substrate conveying and processing system in which an exposure process is combined with a resist process including resist coating and development and a substrate is successively conveyed to the respective processing units as disclosed for example in U.S. Pat. No. 4,900,939 (Aoyama).

In this way, the stitching errors at the respective abutting portions between the subdivision areas in the composite pattern are preliminarily measured and alignment compensating values or offset values respectively tending to reduce the stitching errors at the respective abutting portions (so as to become less than a given tolerance value), ideally to zero, are computed by a computer. The compensating values are introduced as the shift amounts and/or the offset amounts for rotation during the original image alignment or the compensating values for the substrate movement and alignment into the control variables of the control system for the main exposure.

In the exposure method of the present invention, of the original images for forming a composite image, the subdivision area of the original image which is exposed first can serve as a reference for the alignment of the subdivision areas of the original images to be exposed at the second and subsequent times. In this case, with the original image which is to be exposed first, the measurement and alignment compensation for the amounts of deviation in exposure position (the amounts of deviation relative to the design positions) are necessary when the positions of the mark patterns on the original image involve any errors relative to the design positions and they are not necessary when there is no error. In any case, however, the position measurement of the mark patterns in terms of the apparatus reference position coordinates is required for the original image to be exposed first. It is to be noted that where a test exposure is effected, there is no need to especially effect such mark position measurement and it is only necessary to directly measure the amounts of deviation in relative position between the adjoining ones of the plurality of subdivision areas formed on the substrate.

After the position measurement of the mark patterns in terms of the apparatus reference position coordinates has been completed for the original image to be exposed first, its amounts of deviation in exosure position (relative to the design positions) are measured as occasion demands and the regular position information of the exposed subdivision area is obtained. Thus, the alignment position based on the regular position information of the exposed subdivision area of the first original image serves as a reference position of positional deviation compensating values for the original image to be exposed at the second and subsequent times.

On the other hand, in the exposure apparatus of the present invention the substrate composed for example of transparent glass whose surface is covered with a thin film of light sensitive resist is carried on the known X-Y stage means and it is moved within a plane. The original image containing an optical pattern to be transferred onto the resist film of the substrate is generally known as a reticle and the reticle is held parallel to the surface of the substrate through a space by holding means which is called as a reticle stage. It is to be noted that this space is generally as small as possible in the case of a proximity exposure apparatus and it is relatively wide in the case of a projection exposure apparatus or a mirror projection exposure apparatus in which a projection optical system, a reflection optical system or the like is arranged in the space.

In accordance with the present invention, the holding means or the reticle stage is of the type including a plurality of adjustable reticle holders capable of accurately holding a plurality of original image reticles at given positions within a predetermined reference plane and the reticles thus held are successively brought to the exposure position. The method of setting the reticle in the exposure position by the reticle stage may be any one a reciprocating type in which the reticle stage is caused to make a linear motion in the x or y direction and a rotary type in which the reticle stage is caused to make a rotary motion within the x-y plane. In order to move the reticle to the setting position, the moved position of the holding means is measured and controlled by well known position measuring means such as laser interferometers.

During the setting to the exposure position by the reticle stage, each of the original image reticles is aligned on the reticle holder relative to the reference position of the exposure apparatus. For this purpose, the original image alignment means includes x-, y- and $\theta$-axis alignment microscope means for measuring the alignment marks of the reticle by using the refernce marks corresponding to the apparatus reference position as collimations. The collimation positions of these alignment microscopes can be shifted in the x and y directions or can be rotated about the $\theta$ axis within the x-y plane by the amounts corresponding to the compensating values based on the previously mentioned measurement results, thereby effecting the adjustments according to the so-called offset amounts. As the method of detecting the marks within the observed image of the alignment microscope, it is possible to use any of various types including for example an image sensor of the CCD type and a spot scanning type. Also, in order to apply the offset amounts to the alignment microscope, it is only necessary for example to shift the collimation in terms of the picture elements in the photoelectric detecting surface of the CCD sensor or the like in the microscope or to change the inclination of the plane parallel glass to shift the S-curve characteristic of the detection signal from the microscope.

The optical means for exposing the pattern of the original image onto the light sensitive resist film of the substrate is such that in the case of the proximity exposure apparatus, for example, the exposure light (collimated light beam) is irradiated with a practically uniform illuminance distribution on the original image reticle, whereas in the case of the projection exposure apparatus, etc., the exposure light (the collimated light beam) illuminates the original image reticle with a practically uniform illuminance distribution, thereby imaging the original image pattern on the resist by the transmitted light with a given magnification.

The stage means holding the substrate is movable relative to the original image at least in the x and y directions by moving means including a motor and a transmission mechanism. Of course, the moved position of the stage means in each direction of movement is measured and controlled by position measuring means including a laser interferometer or the like.

The moving means of the stage means is controlled by the control means and the control means controls the moving means in such a manner that basically regarding the exposure area of each original image on the substrate as an individual subdivision area, the position of the substrate is changed relative to each original image for the exposure of its subdivision area so as to eventually form on the substrate a composite exposure area of a relatively large area composed of a composite area made by abutting and combining the plurality of subdivision areas. In this case, the amount of movement of the stage means effected by the control means basically corresponds to the exposed size of each subdivision area.

The compensating means is supplied with the previously mentioned preliminarily determined stitching errors at the abutting portions of the subdivision areas as preset information and it computes compensating values for reducing the stitching errors at the abutting portions to become less than a given tolerance value. Also, the compensating means supplies offset amount information to the original image alignment means and the control means so as to incorporate the compensating values in the previously mentioned original image alignment positions relative to the apparatus reference position.

Thus, if, for example, during the alignment of each original image reticle with the apparatus reference position, the alignment of the reticle is effected after the offsets have been added to the collimation positions in such amounts representing the amounts of shift and/or the amount of rotation corresponding to the compensating values and the offsets for the shift amonts are handled by the substrate stage means, the amount of movement of the substrate is adjusted by adding the shift offset amounts corresponding to the compensation amounts to the commands applied to the control means for the amounts of movement of the moving means.

Where a rotational error about the $\theta$ axis is measured along with shift errors in the x and y directions during the measurement of the amounts of deviation of the original image in exposure position, the mask pattern of the original image must be provided at least at each of two or more locations. Also, in order to improve the measuring accuracy of rotational error, more preferable result can be obtained with increase in distance between the two points. Also, where the distortion of the projection optical system is additionally taken into consideration, the mark must be arranged at each of two or more points along each of the surrounding four sides on the reticle (subdivision area).

Also, in this case, while the pattern elements which are present within the effective exposure area of the original image and having the known design position information can be utilized, depending on the circumstances, it is possible to use special marks formed on the reticle peripheral portion on the outer side of the effective exposure area, such as, the alignment marks of the linear form or diffraction granting pattern form directed in the x direction and/or the y direction. In this case, the spacing dimension between the alignment marks and the effective exposure area is known as the design information so that when obtaining a composite pattern by abutting and combining in the main exposure, there are cases where this spacing dimension is also introduced as an offset amount into the compensating values.

With these alignment marks formed on the reticle peripheral portions on the outside of the effective exposure areas, when measuring their exposure positions or exposing them onto the thin resist film of the substrate, the irradiation area of the exposure light by the optical system must be made wider than the effective exposure area of the original images. Thus, in this case, the optical system is provided for example with visual field adjusting means such as a variable-type reticle blind.

Where there is further provided measuring means for measuring the mask patterns of the original image reticle, i.e., the reticle in the exposure position on the holding means according to the position coordinates of the apparatus reference position, the measuring means is designed so that after the reference marks (fiducial marks) preliminarily fixedly mounted on the stage means to provide the apparatus reference position have been moved by the stage means, the mark patterns of the original image reticle are scanned by the inverted projected images of the reference marks and the coincidence positions of the two marks are measured on the position cordinate system of the stage means.

The light sensing system of this measuring means may be constructed by incorporating a photosensitive element such as a photomultiplier in the optical system of each alignment microscope in the original image alignment means or by incorporating the similar photosensitive elements in the main illumination optical system of the optical means. This measuring means can also be utilized for the purpose of base line measurement by the position detection of the reference marks, for the distortion measurement of the projection optical system through the position detection of the various parts of the exposed patterns, for the focusing plane measurement, etc.

After the alignment marks have been measured by the measuring means, the measurement results of the original images which are to form the abutting subdivision areas of a composite pattern are compared with the design position information, thus determining the deviations and thereby calculating the stitching errors at the abuting portions.

In accordance with the present invention, it is possible to substantially eliminate the occurrence of image stitching errors between the subdivision areas in the image composition according to the conventional exposure method, thereby improving the quality of the composite area on the whole and improving the product yield in the lithographic operation.

As described hereinabove, in accordance with the present invention, when using a plurality of original image reticles to effect the exposure according to the butting composing technique, even if positional errors of the alignment marks due to reasons from the manufacturing point of the original image reticles, detection errors by the reticle alignment systems, distortions of the projection optical system, etc., are involved, the original images can be exposed at the positions preliminarily compensated for the resulting stitching errors and there is thus effect of producing a quality composite pattern in which the original image patterns of the original image reticles are abutted and combined with a high degree of accurary.

The above and other objects, features and advantages of the present invention will become more apparent from the following description of illustrative embodiments of the invention taken in conjunction with the accompanying drawings.

BRIEF DESCRIPTION OF THE DRAWINGS

FIGS. 1a to 1d show the outline of an exposure system to which an exposure method according to an embodiment of the present invention is applied, with FIG. 1a showing a schematic diagram of an exposure apparatus of the pattern abutting and composing type, FIG. 1b a plan view showing an example of an original image reticle, FIG. 1c a schematic view showing an example of a composite pattern involving positional deviations, and FIG. 1d a schematic view showing an example of a composite pattern without positional deviations.

FIG. 2a is an enlarged view showing an example of an exposed composite image useful for explaining the principle of the exposure method according to the embodiment of the present invention, and FIG. 2b is an enlarged view of the portion near to the measuring point $P_3$.

FIG. 3 shows schematic views showing examples of the arrangement of the alignment marks in the four original image reticles $R_1$ to $R_4$ used in the embodiment.

DESCRIPTION OF THE PREFERRED EMBODIMENTS

Figure 4:
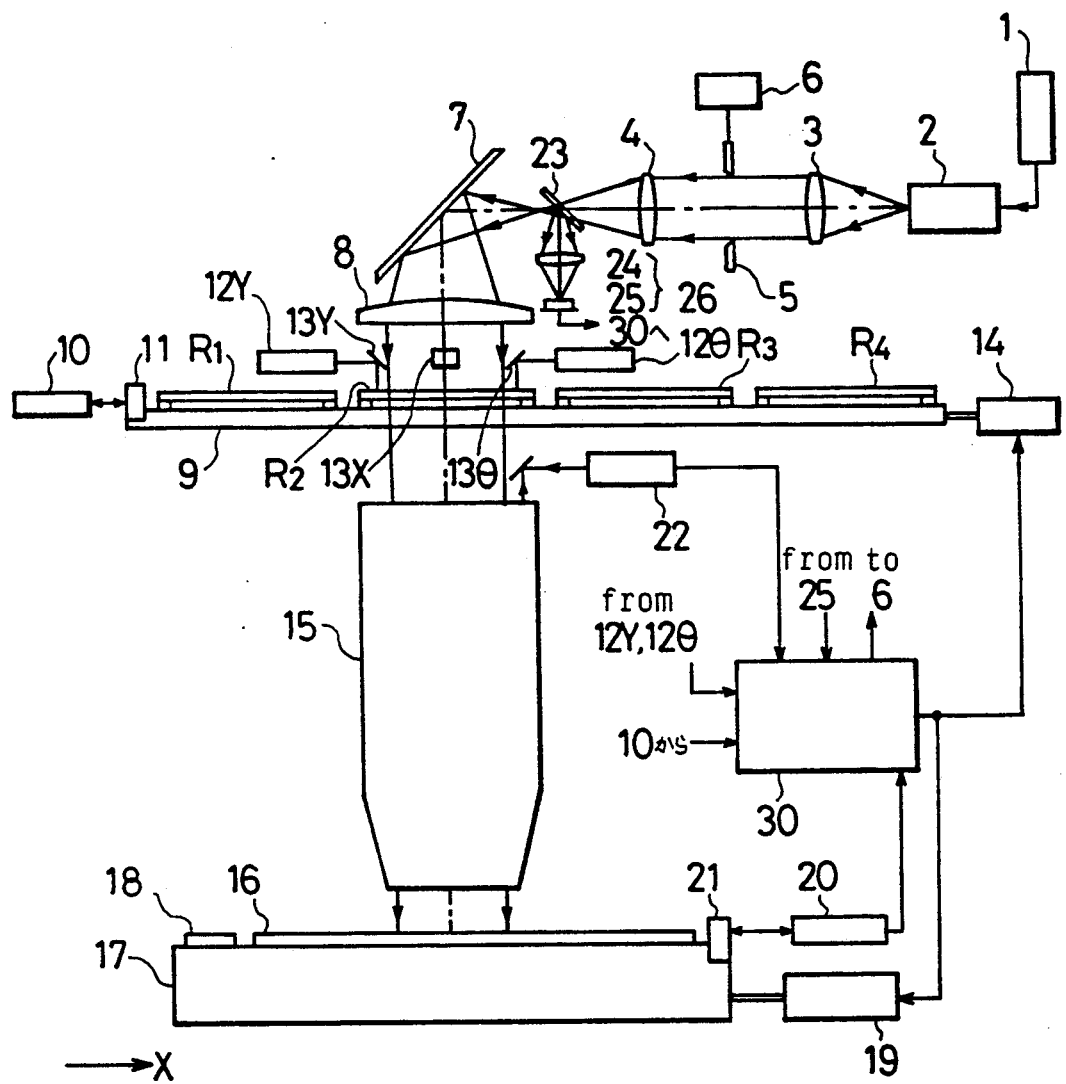
FIG. 4 is a schematic diagram showing the construction of an exposure apparatus according to another embodiment of the present invention.

FIGS. 1a to 1c show the outline of an exposure system to which an exposure method of the present invention is applied, with FIG. 1a showing a schematic diagram for an exposure apparatus of the original image composition type, FIG. 1b a plan view showing an example of the original image reticle, FIG. 1c a schematic view showing an example of a composite pattern involving positional deviations, and FIG. 1d is a schematic view showing an example of a composite pattern without positional deviation.

In FIG. 1a, symbol P designates a glass substrate, and the substrate P is held on stage means which is not shown and movable in two directions which are respectively designated by arrows x and y and perpendicular to each other in the Figure. Arranged above the substrate P are a plurality of original image reticles $R_1$ to $R_4$ which are parallel to the substrate P through a projection optical system PL. These reticles are adapted to be brought to an exposure position of the projection optical system PL by a reticle stage (not shown) one at a time.

The reticle $R_1$ contains an original image pattern a as its effective exposure area. Similarly, the reticle $R_2$ contains an original image pattern b, the retifcle $R_3$ an original image pattern c and the reticle $R_4$ an original image pattern d. In accordance with the predetermined target step positions, the substrate P is moved stepwise by the stage means so that the respective reticles are successively placed in the exposure position on the projection optical system PL and are exposed. Thus, four subdivision areas $S_1$ to $S_4$ respectively containing the patterns a to d are stitched together so as to abut one another at their peripheral edges on the substrate P, thereby forming an exposed pattern having a single large-area composite pattern $S_p$.

Generally, as shown in FIG. 1b, the original image reticle $R_1$ includes an effective exposure area PA containing the original image pattern a composed for example of a liquid crystal device array pattern and alignment marks $m_1$ to $m_3$ respectively formed on the three sides of the peripheral area within the effective exposure area, and this is the same with the other original image reticles $R_1$ to $R_4$. When the reticle is set in the exposure position on the projection optical system PL, the alignment marks $m_1$ to $m_3$ are utilized for the alignment of the reticle with an apparatus reference position by reticle alignment microscopes which are not shown, thereby controlling such that the operation of stopping the stepping movement of the stage means carrying the substrate P and positioning it is effected and the proper composite pattern $S_p$ is formed.

Then, where the alignment marks of the original image reticles involve positional faults due to the errors caused during the manufacture of the reticles and the projection optical system involves distortion, for example, the exposed pattern of the subdivision areas $S_1$ to $S_4$ obtained by the exposure of the reticles involve shifting errors in the X direction or the Y direction due to the positional faults, the distortion, etc., the rotational errors about the $\theta$ axis or their compound errors and the resulting composite pattern $S_p$ becomes a faulty pattern which is far different from the proper abutting composite pattern as shown in FIG. $1_c$. With the exposure method according to the embodiment of the present invention, if there exist positional faults in the alignment marks of the original image reticles due to the errors caused in the course of their manufacture, the distortion of the projection optical system, etc., compensating values tending to reduce the amounts of relative deviation in exposure position at the abutting portions of the subdivision areas due to such errors (i.e., the stitching errors) to become less than a given tolerance value, that is, to become smaller on an average are supplied as the amounts of offset during the alignment of the reticles or the stepping movement of the substrate, thereby obtaining the proper composite image as shown in FIG. $1d$.

FIG. $2a$ shows an example of an exposed composite pattern useful for explaining the principle of the exposure method in accordance with the embodiment of the present invention. In this case, as shown in FIG. 3, the four original image reticles $R_1$ to $R_4$ are each provided with a total of four alignment marks which are formed on its two sides that abut the subdivision areas of the other reticles when a composite image is formed and which are arranged in predetermined positional relations with the center point or the like of its subdivision area as a reference position. These alignment marks are formed in the peripheral portion which is one the inner side of the effective exposure area of each reticle so that in FIG. 3 they are shown as marks $m_{A1}$, $m_{A2}$, $m_{A3}$, and $m_{A4}$ of the reticle $R_1$, marks $m_{B3}$, $m_{B4}$, $m_{B5}$ and $m_{B6}$ of the reticle $R_2$, marks $m_{C5}$, $m_{C6}$, $m_{C7}$ and $m_{C8}$ of the reticle $R_3$ and marks $m_{D7}$, $m_{D8}$, $m_{D1}$ and $m_{D2}$, of the reticle $R_4$. Each of the alignment marks is provided with a vernier scale mark extended in the x direction and another vernier scale mark extended in the y direction and they are formed such that one of the vernier scales of every corresponding alignment marks serves as a main scale and the other serves as a vernier or auxiliary scale on the composite image.

Now, when the reticle $R_1$ is first set in the exposure position so that its alignment marks are aligned relative to the apparatus reference position by the reticle alignment systems thus effecting the exposure, similarly the reticles $R_2$ to $R_4$ are successively exposed, thereby forming on the substrate a composite pattern $S_p$ composed of four abutted and combined subdivision areas $S_1$ to $S_4$ such as shown in FIG. $2a$. For purposes of facilitating the understanding, this exposure is assumed for example to be a test exposure effected prior to a main exposure.

It is to be noted that where the alignment marks are provided on the outside of the effective exposure area, the test exposure exposes the reticle peripheral portion which will be intercepted by the reticle blind of the illumination optical system or the like in the regular main exposure. In other words, while the main exposure is effected in such a manner that the original image patterns a to d of the subdivision areas $S_1$ to $S_4$ or the effective exposure area of the reticles abut one another, the test exposure is effected in such a manner that the reticle blind is widened so that the alignment marks in the peripheral portions of the reticles are transferred into the exposed patterns so as to be present between the corresponding subdivision areas and that the corresponding subdivision areas are separated from each other by a known width dimension. It is to be noted that while this known width dimension can be absorbed by adding the corresponding offset amount to the collimation positions of the alignment microscopes of the reticle alignment systems during the main exposure to be effected later, there are cases where this offset amount is excessively large as one which is to be applied to the microscopes and generally it is preferable to add this offset amount to the position coordinate values for the stepping movement of the substrate, thereby absorbing the known width dimension on the stage side.

In FIG. $2a$, the subdivision areas $S_1$ to $S_4$ represent the exposed patterns of the original image patterns a to d of the original image reticles $R_1$ to $R_4$ and symbols $P_1$ to $P_8$ designate points at which the accuracy of image composition, that is, the amounts of deviation in exposure position are measured. For instance, taking the case of the point $P_3$, if the alignment marks $m_{A3}$ and $m_{B3}$ of the reticles $R_1$ and $R_2$ are formed properly and if they involve no deviation in exposure position in the subdivision areas $S_1$ and $S_2$, the alignment mark $m_{A3}$ should be at the position $(X_{A3}, Y_{A3})$ from the central point of the original image pattern a and the alignment mark $m_{B3}$ should be at the position $(X_{B3}, Y_{B3})$ from the central point of the original image pattern b in the composite image, thus bringing the positions of the alignment marks $m_{A3}$ and $m_{B3}$ into coincidence with the point $P_3$. The positions of the central points of the respective original image patterns and the proper positions of the measuring points such as $(X_{A3}, Y_{A3})$ and $(X_{B3}, Y_{B3})$ (i.e., the alignment marks) are preliminarily determined as values representing the design values of the reticles plus the magnification of the exposure apparatus, etc., on the apparatus reference position coordinate system.

On the other hand, where a test exposure is effected by using the reticles involving errors in the positions of the alignment marks, as in the case of FIG. $2a$ showing the point $P_3$ and its surroundings in enlarged form, for example, there is caused a deviation or shift in exposure position between the alignment marks $m_{A3}$ and $m_{B3}$. The exposure positions of these alignment marks on the substrate can be precisely measured prior to a main alignment by optical measurements including the scanning of the reticle alignment marks by the inversely projected images of the fiducial marks from the substrate (stage means) side or alternatively the measurement can be effected by optically measuring the exposed patterns after the test exposure has been effected. The vectors $(x_3, y_3)$ obtained from the measurement results represent the amounts of relative deviation in exposure position between the subdivision areas $S_1$ and $S_2$ at the point $P_3$ on the basis of the subdivision area $S_1$ or the stitching errors. To reduce these stitching errors to approach zero in nothing else but to improve the quality of the composite image on the whole. While the number of stitching error measuring points for the subdivision areas can be determined arbitrarily, the number must be greater than that which satisfies certain conditions. Also, where the distortion of the projection optical system is additionally considered, it is necessary to provide two measuring points on each of the four sides surrounding each subdivision area, thus requiring a total of eight marks. This number of measuring points will be described later.

It is to be noted that for the detection of such stitching errors, it is necessary to preliminarily measure and obtain on the apparatus reference position coordinate system the positions of the two points which are known within each of the subdivision areas $S_1$ to $S_4$. As these two points, the specified pattern elements whose positions are known within the effective exposure area of each reticle or specially provided measuring marks can be utilized. Also, where there is no space for the arrangement of such measuring marks within each effective exposure area, a plurality of measuring alignment marks are provided in the peripheral portion outside the effective exposure area of the reticle so as to mutually use them in pair or to form a pair with the specified pattern element whose position within the effective exposure area is known.

It is to be noted that these measuring marks should preferably be formed as marks having vernier scales so that the adjoining marks can read the amount of relative deviation in position between the adjoining marks on the composite image as mentioned previously. Also, where the measuring marks are arranged within the effective exposure area, the marks can be exposed only by the exposure of the subdivision area so that in this case there is no need to widen the opening of the reticle blind when measuring the amount of deviation in exposure position.

After the stitching errors $(x_i, y_i)$ at the respective measuring points $P_i$ (in this embodiment i is 1 to 8) have been measured and positional deviation compensating values for the respective original image reticles are calculated by a method which will be described hereunder. Assuming now that when aligning the original image reticle $R_1$ with the exposure position, if linear shift amounts $(\xi_A, \eta_A)$ and a rotation amount $\theta_A$ of the original image reticle $R_1$ about the central point of the subdivision area $S_1(a)$ are added to the point $P_3$ of FIG. 2a, the previously mentioned stitching errors $(x_3, y_3)$ are changed in a negative direction by the amounts given by the following equation (1)

$$\begin{pmatrix} \Delta x_{A3} \\ \Delta y_{A3} \end{pmatrix} = \begin{pmatrix} \xi_A \\ \eta_A \end{pmatrix} + \begin{pmatrix} \cos\theta_A & -\sin\theta_A \\ \sin\theta_A & \cos\theta_A \end{pmatrix} \begin{pmatrix} X_{A3} \\ Y_{A3} \end{pmatrix} - \begin{pmatrix} X_{A3} \\ Y_{A3} \end{pmatrix}$$

$$\approx \begin{pmatrix} \xi_A - Y_{A3}\theta_A \\ \eta_A + X_{A3}\theta_A \end{pmatrix} \quad (\because |\theta_A| \ll 1) \tag{1}$$

Similarly, when aligning the original image reticle $R_2$ with the exposure position, if positional shift amounts $(\xi_B, \eta_B)$ and a rotation amount $\theta_B$ are added to the point $P_3$, the stitching errors $(x_3, y_3)$ are changed in a positive direction by the amounts given by the following equation (2)

$$\begin{pmatrix} \Delta x_{B3} \\ \Delta y_{B3} \end{pmatrix} \approx \begin{pmatrix} \xi_B - Y_{B3}\theta_B \\ \eta_B + X_{B3}\theta_B \end{pmatrix} \quad (\because |\theta_B| \ll 1) \tag{2}$$

After all, the stitching errors $(x_3, y_3)$ are changed to the amounts $(X_3, Y_3)$ given by the following equation (3) due to the actions of $\xi_A, \eta_A, \theta_A, \epsilon_B, \eta_B$ and $\theta_B$.

$$\begin{pmatrix} X_3 \\ Y_3 \end{pmatrix} = \begin{pmatrix} x_3 \\ y_3 \end{pmatrix} + \begin{pmatrix} \Delta x_{B3} \\ \Delta y_{B3} \end{pmatrix} - \begin{pmatrix} \Delta x_{A3} \\ \Delta y_{A3} \end{pmatrix}$$

$$= \begin{pmatrix} x_3 + \xi_B - Y_{B3}\theta_B - \xi_A + Y_{A3}\theta_A \\ y_3 + \eta_B + X_{B3}\theta_B - \eta_A - X_{A3}\theta_A \end{pmatrix} \tag{3}$$

Here, $x_3$ and $y_3$ respectively indicate the x-direction and y-direction relative positional deviation amounts of the alignment marks $m_{A3}$ and $m_{B3}$ on the composite image when exposed and they can be obtained by calculation from the measurement results of the individual alignment mark positions. Alternatively, where they are measured after the formation of a composite image by test exposure, as for example, the alignment marks may be provided with vernier scale marks to make it possible to directly measure them.

The method of at least squares, the search method (e.g., the method of reducing the maximum error to a minimum), etc., can be used as the method of reducing to near to zero (less than the tolerance value) the stitching errors $(X_i, Y_i)$ of the points $P_i$ measured at a plurality of locations on the exposed patterns of the subdivision areas $S_1$ to $S_4$. Here, a description will be made of the case employing the method of least squares. In other words, the estimate function of the so-called Goussian method of least squares is given by the following equation (4)

$$S = \sum_{i=1}^{n} (X_i^2 + Y_i^2) \tag{4}$$

To reduce this value to a minimum requires that the necessary and sufficient condition given by the following equation (5) is satisfied. It is to be noted that in equation (5) a suffix k represents an original image reticle so that it is A for the reticle $R_1$, B for the reticle $R_2$, C for the reticle $R_3$ and D for the reticle $R_4$.

$$\frac{\partial S}{\partial \xi_k} = 0, \frac{\partial S}{\partial \eta_k} = 0, \frac{\partial S}{\partial \theta_k} = 0 \tag{5}$$
$$(k = A, B, C, D \ldots)$$

Then, if equation (5) is applied to the case of FIG. 2a, the parameters for the respective original image reticles can be determined according to the following equation (6). It is to be noted that in the right member of equation (6), $X_{ki}, Y_{ki}$ represent measuring position data of the measuring points $P_i$, and $x_i, y_i$ represent measured data of the amounts of relative positional deviation in the x and y directions between the adjoining alignment marks on a composite image when exposed (where k=A, B, C, D and i=1~8).

$$\begin{bmatrix} \xi_B \\ \eta_B \\ \theta_B \\ \xi_C \\ \eta_C \\ \theta_C \\ \xi_D \\ \eta_D \\ \theta_D \end{bmatrix} = \Sigma \begin{bmatrix} 4 & 0 & -Y_{B3}-Y_{B4} & -2 & 0 & +Y_{C5}+Y_{C6} & 0 & 0 & 0 \\ & & -Y_{B5}-Y_{B6} & & & & & & \\ 0 & 4 & +X_{B3}+X_{B4} & 0 & -2 & -X_{C5}-X_{C6} & 0 & 0 & 0 \\ & & +X_{B5}+X_{B6} & & & & & & \\ -Y_{B3}-Y_{B4} & +X_{B3}+X_{B4} & +X_{B3}^2+X_{B4}^2 & +Y_{B5}+Y_{B6} & -X_{B5}-X_{B6} & -X_{B5}X_{C5} & 0 & 0 & 0 \\ -Y_{B5}-Y_{B6} & +X_{B5}+X_{B6} & +X_{B5}^2+X_{B6}^2 & & & -X_{B6}X_{C6} & & & \\ & & +Y_{B3}^2+Y_{B4}^2 & & & -Y_{B5}Y_{C5} & & & \\ & & +Y_{B5}^2+Y_{B6}^2 & & & -Y_{B6}Y_{C6} & & & \\ -2 & 0 & +Y_{B5}+Y_{B6} & 4 & 0 & -Y_{C5}-Y_{C6} & -2 & 0 & +Y_{D7}+Y_{D8} \\ 0 & 0 & -X_{B5}-X_{B6} & 0 & 4 & +X_{C5}+X_{C6} & 0 & -2 & -X_{D7}-X_{D8} \\ & & & & & +X_{C7}+X_{C8} & & & \\ +Y_{C5}+Y_{C6} & -X_{C5}-X_{C6} & -X_{B5}X_{C5} & -Y_{C5}-Y_{C6} & +X_{C5}+X_{C6} & +X_{C5}^2+X_{C6}^2 & +Y_{C7}+Y_{C8} & -X_{C7}-X_{C8} & -X_{C7}X_{D7} \\ & & -X_{B6}X_{C6} & -Y_{C7}-Y_{C8} & +X_{C7}+X_{C8} & +X_{C7}^2+X_{C8}^2 & & & -X_{C8}X_{D8} \\ & & -Y_{B5}Y_{C5} & & & +Y_{C5}^2+Y_{C6}^2 & & & -Y_{C7}Y_{D7} \\ & & -Y_{B6}Y_{C6} & & & +Y_{C7}^2+Y_{C8}^2 & & & -Y_{C8}Y_{D8} \\ 0 & 0 & 0 & -2 & 0 & +Y_{C7}+Y_{C8} & 4 & 0 & -Y_{D7}-Y_{D8} \\ 0 & 0 & 0 & 0 & -2 & -X_{C7}-X_{C8} & 0 & 4 & +X_{D7}+X_{D8} \\ 0 & 0 & 0 & +Y_{D7}+Y_{D8} & -X_{D7}-X_{D8} & -X_{C7}X_{D7} & -Y_{D7}-Y_{D8} & +X_{D7}+X_{D8} & +X_{D7}^2+X_{D8}^2 \\ & & & & & -X_{C8}X_{D8} & & & +X_{D7}^2+X_{D8}^2 \\ & & & & & -Y_{C7}Y_{D7} & & & +Y_{D7}^2+Y_{D8}^2 \\ & & & & & -Y_{C8}Y_{D8} & & & +Y_{D7}^2+Y_{D8}^2 \end{bmatrix}^{-1} \Sigma \begin{bmatrix} -x_3-x_4 \\ +x_5+x_6 \\ -y_3-y_4 \\ +y_5+y_6 \\ +x_3Y_{B3}+x_4Y_{B4} \\ -x_5Y_{B5}-x_6Y_{B6} \\ -y_3X_{B3}-y_4X_{B4} \\ +y_5X_{B5}+y_6X_{B6} \\ -x_5-x_6 \\ -x_7-x_8 \\ -y_5-y_6 \\ -y_7-y_8 \\ +x_5Y_{B5}+x_5Y_{B6} \\ +x_7Y_{B7}+x_8Y_{B8} \\ -y_5X_{B5}-y_6X_{B6} \\ -y_7X_{B7}-y_8X_{B8} \\ -x_1-x_2 \\ +x_7+x_8 \\ -y_1-y_2 \\ +y_7+y_8 \\ +x_1Y_{B1}+x_2Y_{B2} \\ -x_7Y_{B7}-x_8Y_{B8} \\ -y_1X_{B1}-y_2X_{B2} \\ +y_7X_{B7}+y_8X_{B8} \end{bmatrix}$$

(6)

In equation (6), the number of parameters is important for the solution. If the three parameters $\xi_k$, $\eta_k$ and $\theta_k$ are obtained for all of the four original image reticles, that is, where the number of parameters is the total number of the original image reticles multiplied by 3, in the right number of equation (6) the inverse matrix becomes irregular and the solution of equation (6) is impossible. In other words, at least the parameters belonging to at least one of the original image reticles must be fixed and thus it is arranged so that the position of the measuring points $P_1$ to $P_4$ of the original image reticle $R_1$ are fixed or they serve as reference positions and the parameters or $\xi_B$, $\eta_B$, $\theta_B$, $\xi_C$, $\eta_C$, $\theta_C$, $\xi_D$, $\eta_D$ and $\theta_D$ are calculated from the measurement point data of the remaining reticles $R_2$ to $R_4$.

As regards the number of measuring points, while it is sufficient to arrange two measuring points at each of the adjoining side portions on the composite image as shown for example in FIG. 2a, where it is desired to decrease the number of measuring points as far as possible, it is possible to omit the number of measuring points so far as the inverse matrix does not become irregular in the right member of equation (6).

While the compensating values $\xi_B$, $\eta_B$, $\theta_B$, $\xi_C$, $\eta_C$, $\theta_C$, $\xi_D$, $\eta_D$ and $\theta_D$ are determined from equation (6) as the offset values to be applied during the alignment of the original image reticles $R_2$ to $R_4$, during the main exposure these compensating values are added to the alignment information of the original image reticles and therefore it is preferable that the alignment of the original image reticles is effected so as to directly align them with the alignment position which has been compensated by the addition of these compensating values. For this purpose, it is only necessary that photoelectric microscopes, for example, are used for the reticle alignment so that the compensating values obtained in the previously mentioned manner are added to the collimation marks of the microscopes and then they are aligned for example with the alignment marks $m_1$ to $m_3$ in FIG. 3.

Of course, the method showed in the above-mentioned embodiment can be applied irrespective of the number of original image reticles and the magnitude of the measuring points. Also, where the image composition is effected by use of a single original image reticle (e.g., a mult-die reticle), the same method as mentioned above can be applied to effect the proper composition. Further, where magnification errors due to the variations in thickness among the respective reticles are taken into consideration, it is only necessary that a compensation is provided for the projection magnification from the original image reticle to the exposed pattern and a magnification $\gamma$ is introduced for example into equation (1) or (2) thereby performing the calculation of equation (6). The following is a rewritten equation corresponding to equation (1) into which the magnification $\gamma$ is introduced with respect to the measuring points $P_1$.

$$\begin{pmatrix} \Delta x_{Ai} \\ \Delta y_{Ai} \end{pmatrix} = \begin{pmatrix} \cos\theta_A & -\sin\theta_A \\ \sin\theta_A & \cos\theta_A \end{pmatrix} \begin{pmatrix} 1+\gamma & 0 \\ 0 & 1+\gamma \end{pmatrix} \begin{pmatrix} X_{Ai} \\ Y_{Ai} \end{pmatrix} - \begin{pmatrix} X_{Ai} \\ Y_{Ai} \end{pmatrix} \quad (7)$$

$$\approx \begin{pmatrix} X_{Ai}\gamma - Y_A\theta_A \\ Y_{Ai}\gamma + X_A\theta_A \end{pmatrix}$$

It is only necessary to perform the calculation of equation (6) after the similar equation to equation (7) has been substituted for the equation of each of the original image reticles such as equation (1) or (2). Also, the number of parameters for each original image reticle need not always be 3 and the present method can be performed even only any arbitrary one of the shift amount and the rotation amount is handled as a variable parameter.

Next, a description will be made of an exposure apparatus of the projection exposure type according to another embodiment of the present invention, and FIG. 4 shows the construction of the exposure apparatus. The illuminating light from an illumination light source 1 is subjected to an optical processing such as illuminance uniformalization and then it is converted to a collimated light beam through a relay lens 3. This collimated light beam is passed through the opening of a variable blind 5 which is controlled by a blind drive 6 so that it is passed as a collimated light beam of a beam cross-section which provides a given illumination field through another relay lens 4. The light beam emerging from the relay lens 4 is passed through a mirror 7 so that its optical path is changed to a falling radiation direction and an original image reticle on a reticle stage 9 is illuminated by the collimated light beam through a condensor lens 8.

In this embodiment, the reticle stage 9 is designed so that four original image reticles $R_1$ to $R_4$ are respectively set on four reticle holders and a position measurement by a laser interferometer 10 is effected by means of a mirror 11 fixedly mounted at the end, thereby making possible to control the moved position by a drive unit 14. It is to be noted that the reticle blind 5 is in a conjugate positional relation with the reticle at the exposure position on the reticle stage 9.

Arranged above the reticle stage 9 are alignment microscopes 12x, 12y and 12θ (the microscope 12x is not shown) which are respectively positioned to respectively observe the alignment marks on the periphery of the reticle (e.g., the marks $m_1$ to $m_3$ in FIG. 1b) through mirrors 13x, 13y and 13θ and thereby to align the reticle at the exposure position with the apparatus reference position, and the observation reference positions by the alignment microscopes or the collimation positions for the alignment marks of the reticle are shifted in the x and y directions and rotated about the axis θ for every reticle by amounts corresponding to the compensating values calculated by a control unit 30 (to be described later) from the measurement results of the previously mentioned stitching errors, thereby providing offsets.

A projection lens 15 is arranged below the reticle stage 9 and a glass substrate 16 is held by stage means 17 so as to be positioned below the projection lens 15. In other words, the stage means 17 flatly holds the glass substrate 16 on its upper surface and a thin film of light sensitive resist is formed on the surface of the glass substrate 16. Also, the stage means 17 is movable in the x and y directions by a drive unit 19 and its moved position is controlled by the position measurement of laser interferometers 20 through mirrors 21 mounted at the stage ends.

Figure 6:
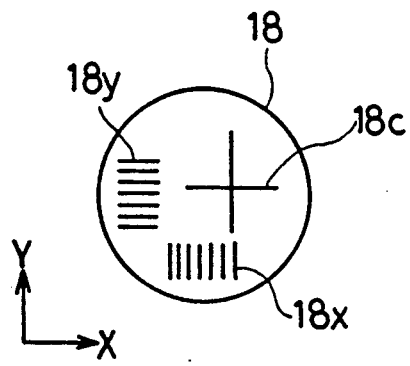
FIG. 6 is a schematic view showing an example of the fiducial marks on the substrate stage.

A fiducial mark (FM) member 18 of substantially the same height as the substrate 16 is fixedly arranged on the upper surface of the stage means 17. As shown in FIG. 6, the FM member 18 is formed on its light shielding window surface with multi-pattern light transmitting marks 18x and 18y in the form of x-direction and y-direction diffraction gratings and a cross-shaped single-pattern light transmitting mark 18c and it is illuminated internally of the stage means 17.

Inserted between the relay lens 4 and the mirror 7 of the illumination system is a semitransparent mirror 23, and the semitransparent mirror 23 is arranged so that the beam from the relay lens 4 is transmitted and the return beam from the mirror 7 is directed to a lens 24 on the outside of the optical path of the illumination system. Also, the lens 24 condenses the beam directed by the semitransparent mirror 23 on the light sensitive surface of a photo-electric detector 25 which in turn electrically detects the light intensity of the condensed beam. The semitransparent mirror 23, the lens 24 and the photo-electric detector 25 constitute the light sensing system of an illumination stage system unit 26 (hereinafter referred to as an ISS unit) for detecting the positional relation between an illuminated image of the FM mark (18x, 18y or 18c) and an image of the reticle alignment mark when the reticle is inversely illuminated from the FM member 18 through the projection lens 15.

Also arranged below the stage 9 is a laser step alignment (LSA) system 22 for making a step movement alignment with respect to the substrate 16 on the stage means 17 through the projection lens 15, and it is constructed so that the LSA system 22 and the ISS unit 26 as well as the laser interferometers 10 and 20, the reticle alignment systems 12x, 12y and 12θ and the drive units 6, 14 and 19 are all controlled by the control unit 30.

Figure 5:
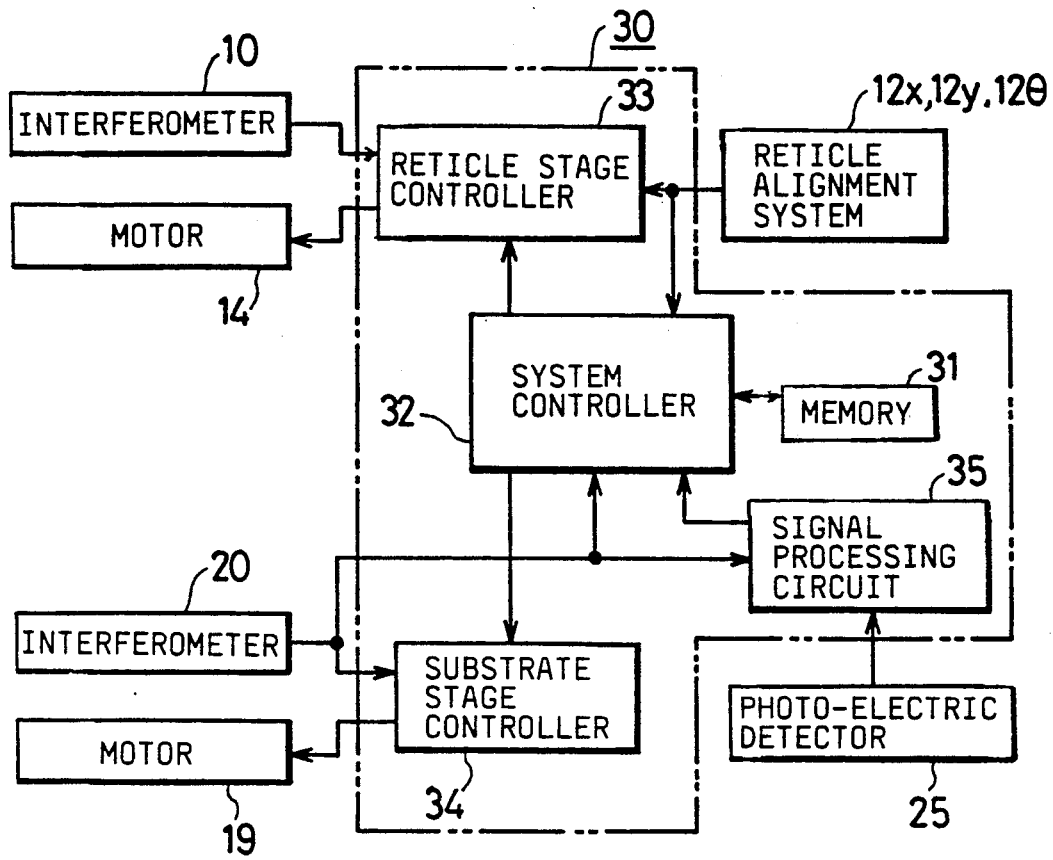
FIG. 5 is a block diagram showing the construction of the control system in the exposure apparatus according to the embodiment of the present invention.

The control unit 30 is constructed as shown in FIG. 5 and it includes a system controller 32 having a memory 31, a reticle stage controller 33, a substrate stage controller 34 and a signal processing circuit 35. The system controller 32 reads out the necessary control information from the memory 31 and supplies to the controllers 33 and 34 control signals corresponding to the measurement information from the laser interferometers 10 and 20, the reticle alignment systems 12x, 12y and 12θ and the ISS unit 26 and the LSA system 22.

The signal processing circuit 35 receives the detection signals from the photo-electric detector 25 and the position measurement signals from the substrate stage laser interferometers 20 to calculate the previously mentioned parameters $\xi_B$, $\eta_B$, $\theta_B$, $\xi_C$, $\eta_C$, $\xi_D$, $\eta_D$ and $\theta_D$ and supply them to the system controller 32. When these compensating values are applied, the system controller 32 supplies the corresponding compensating values to the reticle alignment systems in accordance with the moved position of the reticle stage 9 by the reticle stage controller 33, that is, in accordance with which of the reticles is at the exposure or shot position. More specifically, such offset amounts tending to cancel the stitching errors are applied to the observation reference positions by the alignment microscopes 12x, 12y and 12θ or the collimation positions with respect to the reticle alignment marks.

It is to be noted that instead of supplying the offsets to the respective reticle alignment microscopes themselves, the offset amounts of the respective microscopes may be stored for every reticle so that during the alignment the marks are shifted by the stored offset amounts with respect to the observation reference positions to effect the alignment or alternatively the step positions of the substrate stage 17 may be provided with offsets of such amounts corresponding to the stored offset amounts.

In response to the signals from the laser interferometers 20 and the system controller 32, the substrate stage controller 34 controls the movement of the substrate stage 17 in the x and y directions through the drive unit or motor 19, and also the reticle stage controller 33 controls the movement of the reticle stage 9 through the drive unit or motor 14 in response to the signals from the laser interferometer 10 and the system controller 32.

The method of measuring the positions of the alignment marks of the reticle on the exposed pattern by the control actions of the ISS unit 26 through the control unit 30 will now be described. The FM member 18 on the stage 16 is illuminated from inside the stage 16 and the stage 16 is moved below the projection lens 15, thereby scanning the alignment marks of the reticle at the exposure position by the inverse projected image of the mark 18c or those of the marks 18x and 18y. The scanning result is detected by the photo-electric detector 25 of the ISS light sensing system and then the current position information can be obtained from the laser interferometers 20. While, in this embodiment, the ISS light sensing system 26 is provided in the main illumination system, it may be provided within the reticle alignment systems.

In response to the up/down pulses from the laser interferometers 20, the control unit 30 converts the level of the detection signal from the photo-electric detector 25 to a digital value and enters it as waveform data into the memory 31. Thereafter, the positions of the reticle alignment marks are determined within the coordinate system of the substrate stage 16 by computational operations.

Figure 7A:
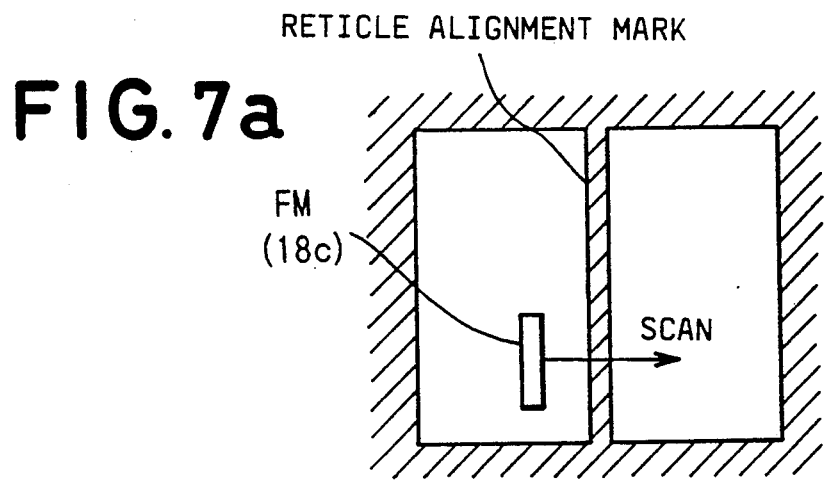
FIG. 7a is a schematic diagram showing the manner in which the position measurement of a reticle alignment mark is effected according to a single pattern mark of the ISS system.
Figure 7B:
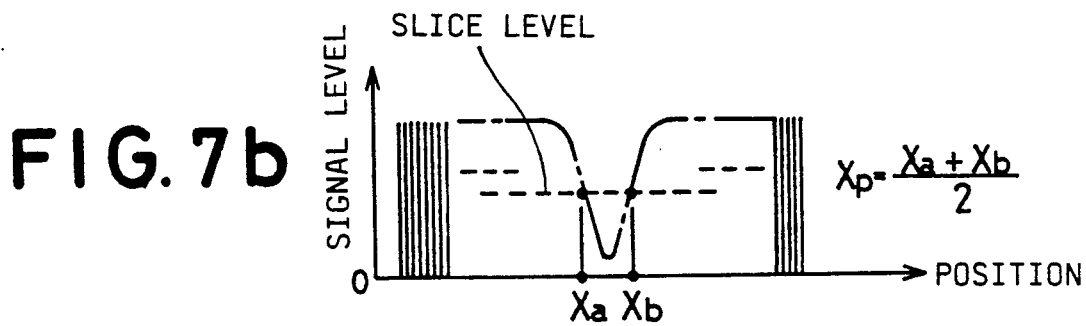
FIG. 7b is a diagram for explaining the measured signal waveform.

For instance, when the reticle alignment mark is in the form of a single bar-type mark as shown in FIG. 7a, if the scanning is effected by the inverse projected image of the mark 18c of the FM member 18, the photo-electric detector 25 generates a detection signal of substantially single-bottom type waveform as shown in FIG. 7b and therefore the control unit 30 calculates the edge positions $x_a$ and $x_b$ of the bottom waveform at a certain slice level by the software handling, thereby obtaining its central position $x_p$.

Figure 8A:
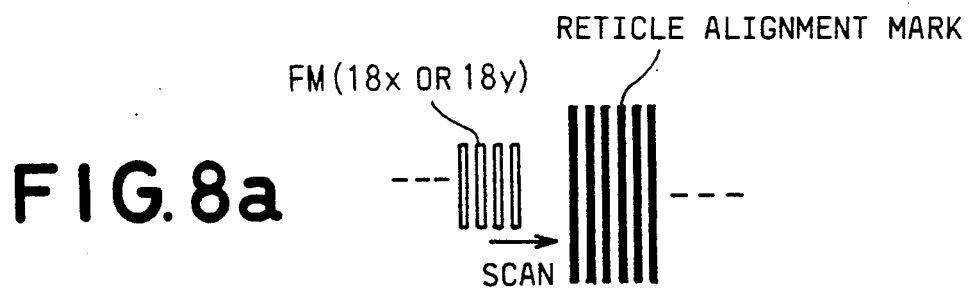
FIG. 8a is a schematic diagram showing the manner in which the position measurement of the reticle alignment mark is effected according to the multi-pattern mark of the ISS system.
Figure 8B:
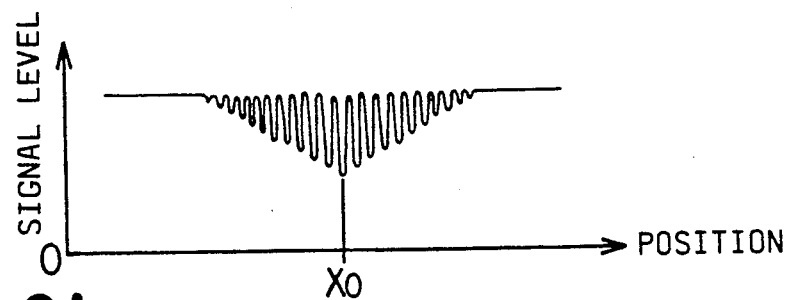
FIG. 8b is a diagram for explaining the measured signal waveform.

Also, where the reticle alignment mark is in the form of a diffraction grating composed of a plurality of straight stripes as shown in FIG. 8a, when the scanning is effected by means of the inverse projected image of the mark 18x or 18y on the FM member 18, as shown in FIG. 8b, the photo-electric detector 25 generates a detection signal of a high-frequency waveform by interference and therefore the control unit 30 performs a phase analysis by the Fourier method in accordance with a software processing thereby determining its central position $x_0$.

In this way, with the reticle at the exposure position, the positions of the alignment marks as the exposed patterns are determined in terms of substrate stage coordinates and stored in the memory 31 whereby position data relating to the previously mentioned measurement points $P_i$, etc., are calculated and in accordance with the results such calculations as shown in the previously mentioned equation (6) are performed, thereby determining compensating values $\xi_k$, $\eta_k$ and $\theta_k$ tending to reduce the stitching errors at the respective abutting portions. During the actual exposure, these compensating values are added as offset amounts to the collimations of the alignment microscopes at the time of the alignment of the reticle in question, so that during the actual exposure this reticle is aligned in accordance with the collimations provided with the offset amounts and an exposed pattern is formed at the proper position whose stitching errors have been cancelled.

In FIG. 4, another alignment system or the LSA system 22 detects the alignment marks on the side of the substrate stage 17 so as to align the reticle with the substrate 16. The position measurement of the alignment marks by means of the LSA system 22 is useful in cases where as for example, a composite image of the reticles $R_1$ to $R_4$ is exposed on trial onto the substrate 16 and the stitching errors of the exposed composite pattern are measured directly. In this case, the position detection of the alignment marks within the exposed pattern may be effected by any of various methods including one in which the latent image of the pattern in the exposed resist is detected by the LSA system 22 and another in which after the exposed substrate resist has been developed, the substrate is returned onto the stage and the uneven alignment marks formed on the substrate (either of the resist image and the prime coat image may be suffice) is detected by the LSA system. It is to be noted that when measuring the mark positions by the LSA system, the position measurement should preferably be effected by providing fine diffraction grating marks each composed of recessed or raised spot mark elements arranged at a constant pitch to form for example a matrix of $7 \times 7$ as the marks in the pattern.

In the later case, the present exposure apparatus can for example be combined advantageously with a coater-developer and an in-line system as disclosed in the previously mentioned U.S. Pat. No. 4,900,939 to construct a substrate conveying and processing system, thereby sequentially processing the resist coating, exposure and developing repeatedly. In this case, the result of the test exposure in this in-line substrate processing system can be measured in an in-line manner by the LSA system 22 of this exposure apparatus so that the adjustment of errors in the image composition can be performed by the common control computer and also the measurement of the test results can be performed within the exposure apparatus, thereby very greatly reducing the danger of contamination by dust, etc.

In other words, during the test exposure the substrate 16 having the resist applied by the resist coater is set on the stage 17 of the exposure apparatus and the reticle $R_1$ is aligned by the alignment microscopes at thier collimation positions to expose the original image pattern a. Then, the substrate 16 is moved by the movement of the stage 17 for the exposure of the next subdivision area and the reticle $R_2$ is similarly aligned by the alignment microscopes at their collimation positions to expose the original image pattern b. Thereafter, similarly the original image patterns c and d of the reticles $R_3$ and $R_4$ are successively exposed. Consequently, a single composite image is exposed on the substrate 16 so that the exposed substrate is transferred to a developer where it is developed and cleaned and then it is returned onto the stage 17 of the exposure apparatus, thereby effecting the position measurement of the alignment marks within the developed pattern by the LSA system 22.

In this case, the LSA system 22 is of the type whereby while projecting a slit-like laser spot through the projection lens 15 onto the alignment marks of the diffraction grating type formed on the substrate 16 by the test exposure and developing, the substrate stage 17 is moved and the intensity of the diffracted light from each of the alignment marks is digitally sampled and subjected to waveform analysis by softwafer within the control unit 30, thereby detecting the positions of the alignment marks within the coordinate system of the substrate stage 17. Its detailed optical construction is as shown in FIG. 9.

Figure 9:
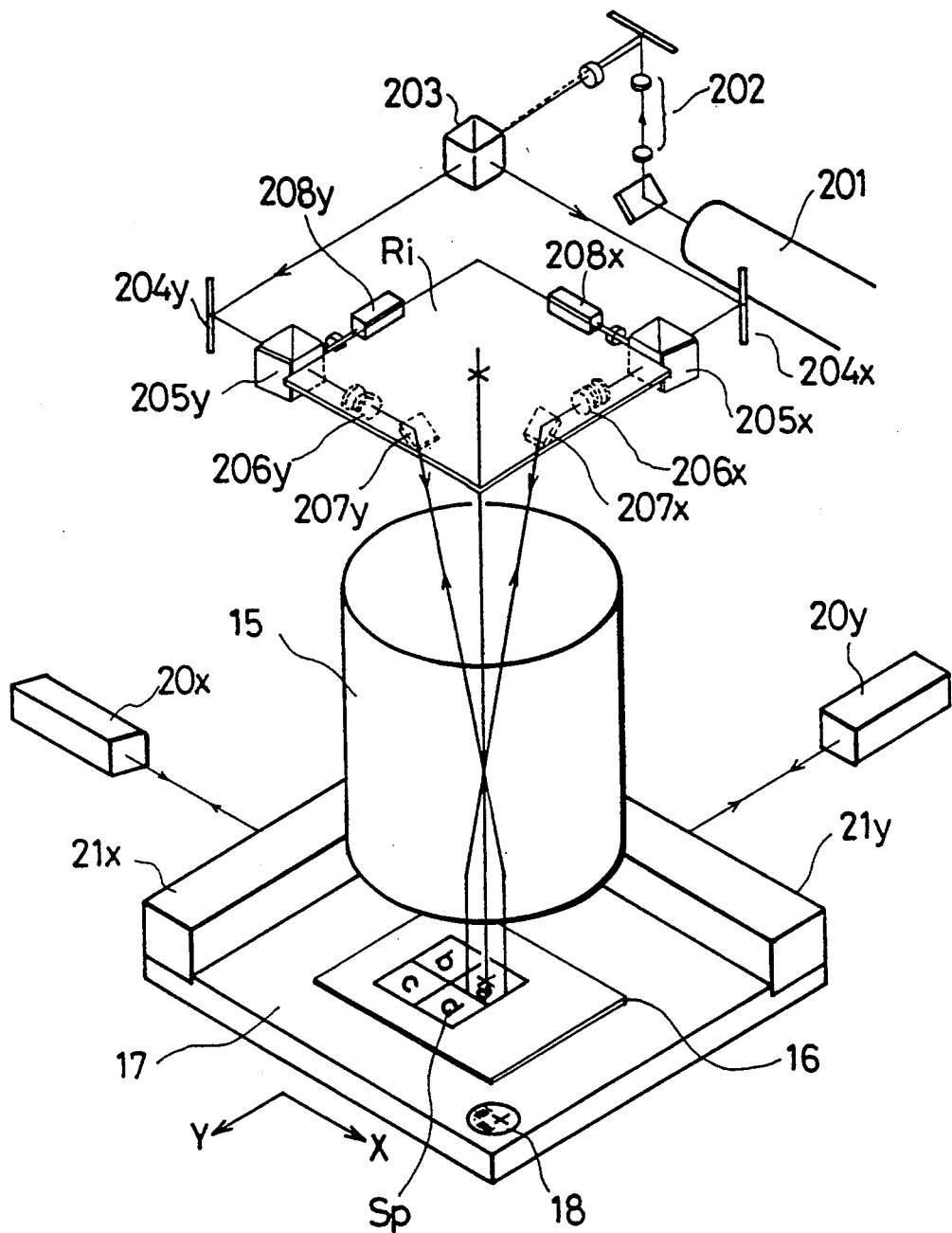
FIG. 9 is a perspective view showing an example of the optical construction of the LSA system.

In FIG. 9, the component parts corresponding to those shown in FIG. 4 are designated by the same reference numerals, and also the mirrors and the laser interferometers of the substrate stage 17 are separately shown as x-direction mirror 21x and laser interferometer 20x and y-direction mirror 21y and laser interferometer 20y, respectively.

As shown above the projection lens 15 in FIG. 9, the optical construction of the LSA system 22 is such that the laser beam irradiated from a laser light source 201 through an illumination optical system 202 including a beam expander, a cylindrical lens, etc., is divided into an x-direction beam and a y-direction beam by a beam splitter 203 and the splitter beams are respectively projected onto the projection lens 15 from the lower side a reticle $R_i$ through mirrors 204x and 204y, beam splitters 205x and 205y, objective lens 206x and 206y and mirrors 207x and 207y. The laser beams passed through the projection lens 15 are projected as a slit-like laser spot extended in the x-direction or the y-direction on the substrate 16 or the FM mark member 18.

As the result of the previously mentioned test exposure and developing process, the transferred patterns of the alignment marks of the reticles $R_1$ are formed as diffraction grating-type uneven patterns on the substrate 16, and also the difucial marks 18x and 18y defining reference positions are formed as diffraction grating-type uneven patterns on the FM member 18. During the measurement of the mark positions by the LSA system 22, the substrate stage 17 is moved in the x direction and the y direction so that these diffraction grating-type marks traverse the slit-like laser spot.

Figure 10:
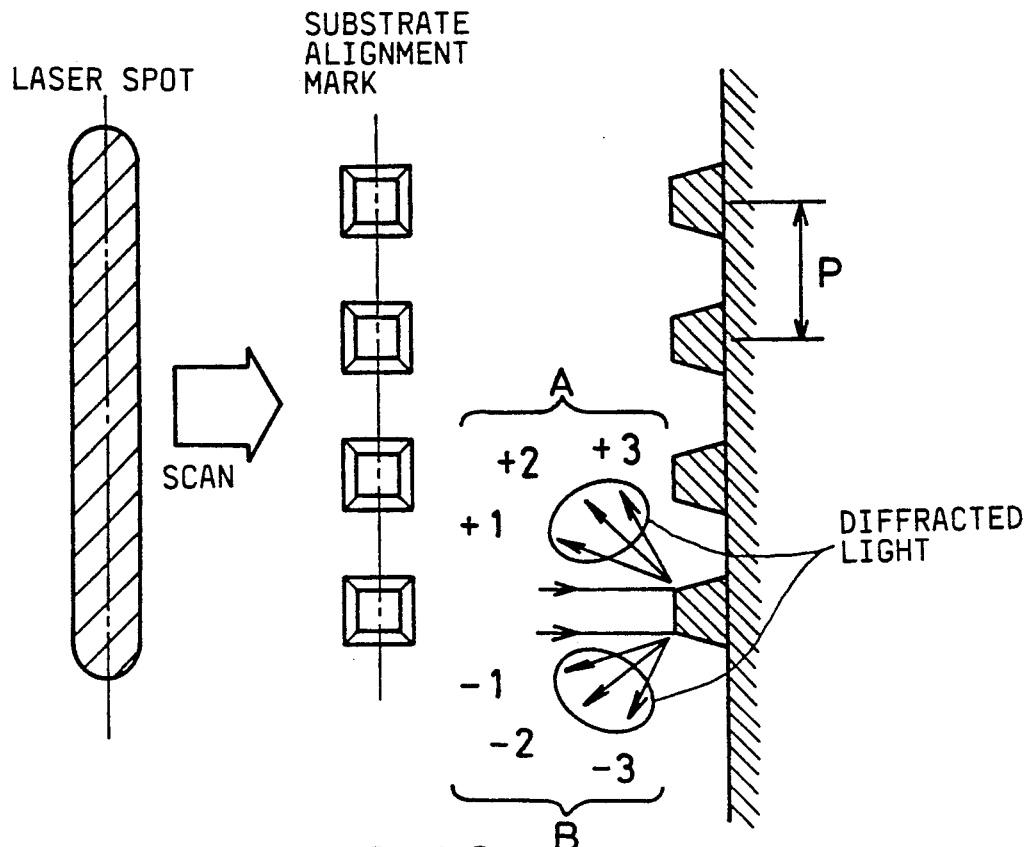
FIG. 10 is a schematic diagram showing the manner in which the alignment marks and the fiducial marks on the substrate stage side are detected by the LSA system.

The relation between each diffraction grating-type mark and the laser spot and the manner in which the diffracted beams are produced from the diffraction grating-type mark are as shown in FIG. 10. The diffracted beams from the mark are respectively returned to the beam splitters 205x and 205y through the projection lens 15 and through the mirrors 207x and 207y and the objective lens 206x and 206y and the beam splitters 205x and 205y respectively direct the light beams to x-axis photo-electric detector 208x and 208y. In this case, each of the photo-electric detectors 208x and 208y photoelectrically detects only the higher-order diffracted beams through a spatial filter which cuts off the 0-order beam (regular reflected beam) and passes only the higher order beams (the ±first-order and higher) of the diffracted beams from the mark.

Figure 11:
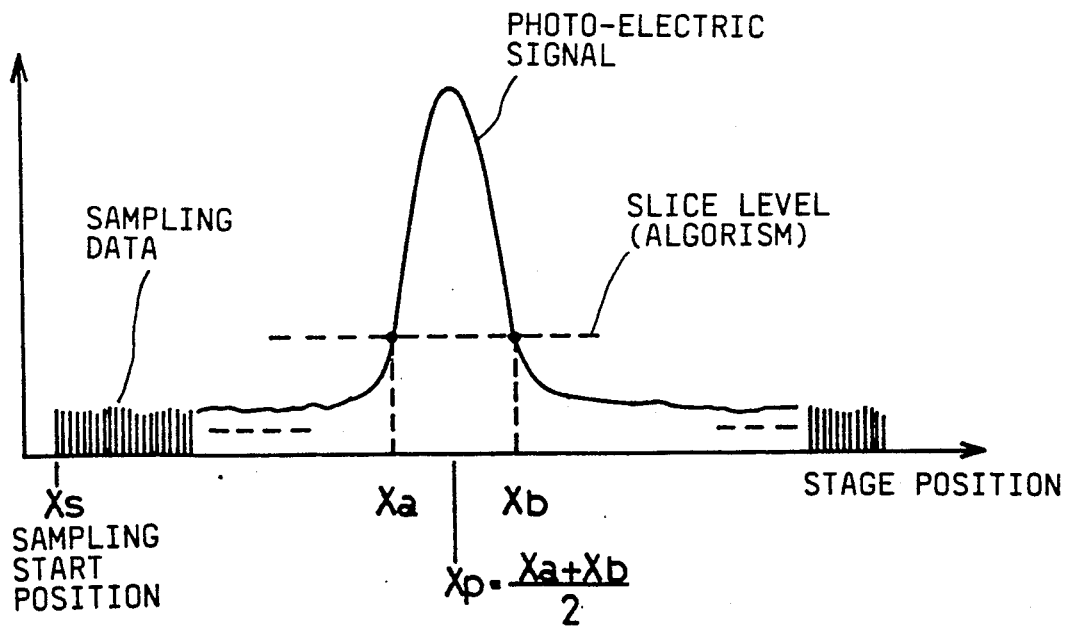
FIG. 11 is a waveform diagram for explaining the measured signal and the manner of its signal processing by the LSA system.

When the diffraction grating-type mark is scanned so as to traverse the laser spot, a photo-electric signal of a Gaussian waveform is generated from the photo-electric detector 208x or 208y as shown in FIG. 11. This photoelectric signal is introduced as waveform data into the signal processing unit in the control unit 30 and the central position of the waveform is obtained by a software processing. This position represents the coordinate value of the substrate stage 17 when the laser spot is brought into coincidence with the diffraction grating-type mark.

Figure 12:
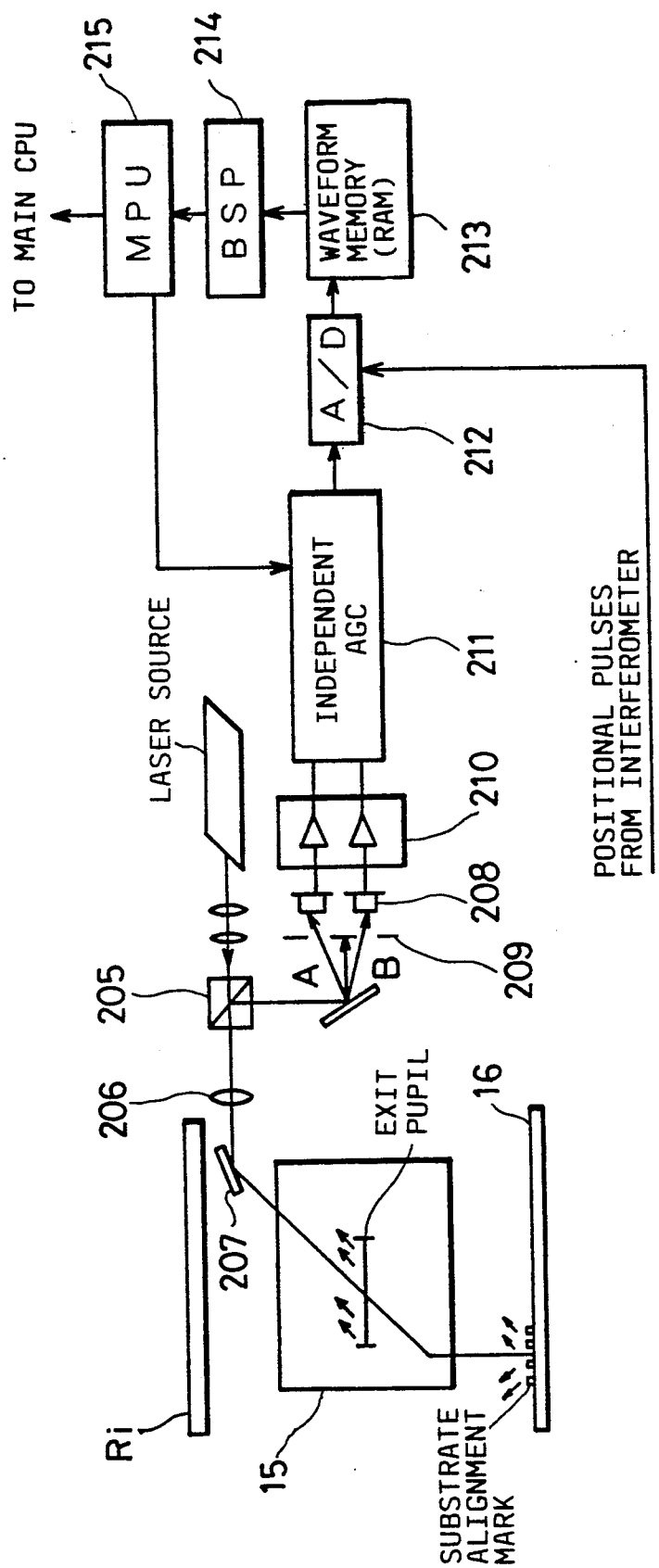
FIG. 12 is a diagram showing in block form the construction of the signal processing units in the control means concerning the LSA system 26.

FIG. 12 is a block diagram showing the signal processing unit within the control unit 30 which is related to the LSA system 22. In the Figure, the component parts corresponding to those shown in FIG. 9 are designated by the corresponding numerals but the distinction between the x and y directions is omitted. In this example, of the diffracted beams from the diffraction grating-type mark on the side of the substrate stage 17, the higher order beams are extracted by a spatial filter 209 so that the beams are separately detected photoelectrically by a positive-order channel A and a negative-order channel B as shown in FIG. 10. These photoelectrically detected signals are first amplified by a preamplifier 210, are separately set to given gains in an AGC circuit 211 and then applied to an A/D converter 212.

In response to the positional signal or up/down pulses from the laser interferometer 20x or 20y of the substrate stage 17, the A/D converter 212 digitally samples the Gaussian waveform of the photo-electric signal as shown in FIG. 11. While the digital data resutling from the sampling is stored in a waveform memory (RAM) 213, at this time there is the one-to-one correspondence between the address of the waveform memory 213 and the moved position of the substrate stage 17.

The digital waveform data introduced into the waveform memory 213 is processed for example by a software operation of a high-speed processor 214 such as a bit-slice processor and a mark central position $X_p$ is determined as shown in FIG. 11. Such mark central position is determined for each of the previously mentioned measuring points $P_i$ so that these positions are sent to an LSA system processing unit (MPU) 215 and they are used for the purpose of the previously mentioned calculation of compensating values, etc., by the main control unit of the control unit 30.

The calculation results of the compensating values are stored in the memory 31 of the control unit 30 as the offset information for the reticle alignment systems for the next exposure, and during the next exposure the reticle alignment systems effect the alignment of each reticle in accordance with the positional references to which the offset amounts have been added. With the exposed patterns of the reticles exposed in this way, the positional errors of the reticle alignment marks are cancelled and therefore an accurate composite image conforming with the design data is formed.

It is to be noted that while, in the present embodiment, the sensor (the photo-electric detector 25) of the ISS unit 26 is used for the position measurement of the reticle alignment marks, any sensor other than the ISS unit, e.g., a photo-electric detector arranged below the FM member 18 may be used to effect the measurement of the mark positions. Also, even in the case of the ISS unit, instead of having recourse to the measurement by the return beams to the illumination system as in the case of the present embodiment, the method of photoelectrically detecting the reflected beams from the reticle backside (the pattern containing surface) through the FM member 18 may be used. Further, the construction of the reticle alignment systems and the detecting method are arbitrary and also there is reason why the three axes must always be used.

For instance, where the imaging characteristic of the projection optical system involves a distortion, etc., it is possible to arrange so that after the imaging characteristic has been measured and compensated, the position measurement of the reticle marks according to the present invention is effected. In this case, if the optical system is a refraction system, for example, the imaging characteristic of the projection system can be compensated by the movement and tilting of at least one desired lens element of a plurality of lens elements or the vertical or tilting movement of the reticle, thereby reducing the offset amounts for compensation corresponding to the stitching errors. Also, in this case, by utilizing the ISS unit for the position measurement of the reticle marks, it is possible to start again the position measurement of the reticle marks immediately after the compensation of the imaging characteristic of the projection optical system, thereby making it possible to effect the compensation in a real time manner.

In accordance with the present invention, where the ISS unit is utilized for the position measurement of the reticle marks, the reticle alignment microscopes do not take part in this position measurement. Also, while the embodiment shows the method in which the offset amounts corresponding to the determined stitching errors are added to the collimations of the reticle alignment microscopes to compensate the exposure position, if the laser interferometer of the reticle stage is used in combination with the ISS unit, the offset amounts can be added as positional corrections for the reticle stage and a proper composite image can be exposed without substantially using the reticle alignment microscopes.

Further, where a test exposure is effected prior to a main exposure to measure the mark positions, it is possible to arrange so that after a pre-alignment by the reticle alignment microscopes and a fine alignment by the ISS unit have been effeced, a test exposure is effected to perform the measurement of the mark positions according to the present application.

Also, while, the present embodiment has been described by taking the case in which the stitching errors are reduced on an average by use of the method of least squares, as for example, the search method may be used to determine off-set amounts such that of a plurality of stitching errors (four in the embodiment), the value of the maximum error is reduced to a minimum. In short, it is only necessary to determine offset amounts so that all the stitching errors are reduced to zero or less than a given tolerance value and its determining method may be any of the techniques in addition to statistic procedures as the method of least squares and the search method.

Also, with liquid crystal devices, there are cases where the stitching accuracy is allowed to be less severe with respect to one or the other of the X and Y directions. In the formation of gate lines, for example, the accuracy with respect to the lengthwise direction of the gate lines may be less severe as compared with the short-dimension direction (width direction). Thus, in such cases, it is possible to respectively preset tolerance values for stitching errors with respect to the X and Y directions so that offset amounts for the X and Y directions are separately determined in accordance with the preset values. It is to be noted that the present invention is also effective in cases where an image composition is effected by using only a single pattern. For instance, if three of the same pattern are stitched together in one direction to produce a composite pattern, it is only necessary to determine offset values so that the stitching errors at the two abutting portions are reduced on an average. In such case, there is no reticle changing and therefore the distortion of the projection optical system constitutes a main cause of the occurrence of stitching errors.

What is claimed is:

1. A method of using at least one of a plurality of original images each containing the same or a different pattern, and moving positions of a light-sensitive substrate and each of said original images relatively so as to successively expose said patterns in such a manner that a plurality of subdivision areas, each composed of an exposure area of each of said original images, are abutted and combined thereby exposing a composite pattern composed of said plurality of patterns stitched together on said light-sensitive substrate, whereby when aligning said original images and said light-sensitive substrate pattern by pattern in accordance with predetermined target position information, said method comprising the steps of:

preliminarily determining amounts of relative deviation in exposure position at abutting portions of said subdivision areas in said composite pattern;

adding compensating values to said target position information so as to reduce said amounts of deviation in exposure position at said abutting portions to less than a predetermined tolerance value; and aligning said original images and said light-sensitive substrate pattern by pattern.

2. A method according to claim 1, wherein said compensating values are computed by statistically calculating said amounts of deviation in exposure position in such a manner that said amounts of deviation in exposure position at said abutting portions are reduced on an average.

3. A method according to claim 1, wherein positions of at least two mark patterns preliminarily provided for each of said original images are measured as positional coordinates for a reference position of an exposure apparatus, and wherein said amounts of deviation in exposure position are determined in accordance with results of measurement of said original images associated so as to form said abutting subdivision areas.

4. A method according to claim 1, wherein a test exposure is preliminarily performed for at least pair of said original images which form abutting subdivision areas, and wherein said amounts of deviation in exposure position are obtained by actual measurement from results of said trial exposure.

5. A method according to claim 4, wherein when effecting said test exposure, an effective exposure area is widened thereby effecting a test exposure including mark patterns formed on a peripheral portion of each of said original images.

6. A method according to claim 4, wherein each of said original images is preliminarily formed with a plurality of mark patterns each including vernier scales respectively constituting a micrometer-like main gauge and an auxiliary gauge and arranged at locations corresponding to said abutting portions associated therewith whereby at the time of said test exposure, the scales of said mark patterns exposed on said light-sensitive substrate are read to determine said amounts of relative deviation in exposure position at said abutting portions.

7. A method according to claim 4, wherein after said test exposure has been effected, the resulting exposed patterns are developed whereby positions of the mark patterns of said subdivision areas are measured as positional coordinates with respect to said apparatus reference position, and in accordance with results of said measurement of said abutting subdivision areas said amounts of relative deviation in exposure position are determined.

8. A method according to claim 7, wherein said test exposure, said development and said position measurement of said developed mark patterns are successively performed by a system of units including substrate conveying means.

9. A method according to claim 1, wherein said amounts of deviation in exposure position are determined on the basis of one of said original images exposed first whereby the other of said original images to be exposed second and subsequently are each caused to make linear movements and/or a rotational movement relative to said light-sensitive substrate by amounts of compensating values corresponding to said amounts of deviation in exposure position of said first original image thereby aligning the same with said light-sensitive substrate.

10. A method according to claim 1, wherein said light-sensitive substrate comprises a glass substrate whose surface is covered with a thin light-sensitive film.

11. A method of using at least one of a plurality of original images each containing the same or a different pattern, and moving a light-sensitive substrate in stepping movements of a predetermined amount so as to abut and combine at least three subdivisional areas each composed of an exposure area of one of said original images thereby successively exposing said patterns to expose a composite pattern including at least three of said patterns stitched together on said light-sensitive substrate, whereby when aligning said original images and said light-sensitive substrate pattern by pattern in accordance with predetermined target position information, said method comprising the steps of:

preliminarily determining amounts of deviation in exposure position at an abutting poriton of at least two of said subdivision areas in said composite pattern;

adding compensating values to said predetermined target position information in such a manner that said amounts of deviation in exposure position at said abutting portion of said at least two original images are reduced to less than a predetermined tolerance value; and aligning said original images and said light-sensitive substrate pattern by pattern.

12. An exposure apparatus comprising:

stage means adapted to hold a light-sensitive substrate and movable within a plane;

holding means for holding a plurality of original images each containing an optical pattern to be transferred on said light-sensitive substrate substantially parallel to said light-sensitive substrate;

original image alignment means for aligning each of said original images with respect to a reference position of said exposure apparatus;

optical means for exposing the pattern of each of said original images on said light-sensitive substarate;

moving means for moving said light-sensitive substrate on said stage means relative to each of said original images;

control means whereby when successively exposing on the same light-sensitive substrate at least one of said plurality of original images each containing the same or a different pattern, said moving means is controlled in accordance with predetermined position information in such manner that a plurality of subdivision areas each composed of an exposure area by at least one of said original images are abutted and combined; and compensating means for calculating compensating values tending to reduce predetermined amounts of relative deviation in exposure position at the abutting portions of said subdivision areas to less than a predetermined tolerance value and applying said compensating values to said control means and said original image alignment means.

13. An apparatus according to claim 12, further comprising measuring means for measuring positions of at least two mark patterns preliminarily provided for each of said original images as positional coordinates with respect to the reference position of said exposure apparatus, and wherein said compensating means calculates said compensating values in accordance with results of said measurement of said original images which are to form abutting subdivision areas.

14. An apparatus according to claim 13, wherein said measuring means includes reference marks fixedly mounted on said stage means, and projection means for inversely projecting said reference marks on each of said original images whereby said stage means is moved so as to scan the mark patterns of each of said original images by the inverse projected images of said reference marks, thereby measuring the positions of said mark patterns on said exposure apparatus.

15. An apparatus according to claim 12, further comprising means for detecting the mark patterns of each of said original images exposed and developed on said light-sensitive substrate, said detecting means including means for projecting a slit-like light beam onto each of said mark patterns, and light sensing means for receiving diffracted beams from said developed patterns whereby said stage means is moved to scan said mark patterns by said light beam and thereby to detect said mark patterns.

16. An apparatus according to claim 12, wherein said original image alignment means comprises a plurality of alignment microscopes for aligning each of said original images with said apparatus reference position, and wherein said compensating means adds said compensating values to collimation positions of said alignment microscopes.

17. An apparatus according to claim 12, wherein, said optical means includes a variable field aperture for varying said effective exposure area.

18. An apparatus according to claim 12, wherein said light-sensitive substrate comprises a glass substrate whose surface is covered with a thin light-sensitive film.

* * * * *